United States Patent
Kim et al.

(10) Patent No.: US 8,378,726 B2
(45) Date of Patent: Feb. 19, 2013

(54) CLOCK SIGNAL DUTY CORRECTION CIRCUIT

(75) Inventors: Yong Ju Kim, Icheon-si (KR); Dae Han Kwon, Icheon-si (KR); Won Joo Yun, Icheon-si (KR); Hae Rang Choi, Icheon-si (KR); Jae Min Jang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 279 days.

(21) Appl. No.: 12/846,669

(22) Filed: Jul. 29, 2010

(65) Prior Publication Data

US 2011/0267124 A1 Nov. 3, 2011

(30) Foreign Application Priority Data

Apr. 30, 2010 (KR) .................. 10-2010-0040549

(51) Int. Cl.
*H03K 5/04* (2006.01)
(52) U.S. Cl. ..................... 327/175
(58) Field of Classification Search .............. 327/175
See application file for complete search history.

(56) References Cited

U.S. PATENT DOCUMENTS

| | | | |
|---|---|---|---|
| 6,573,779 B2 | 6/2003 | Sidiropoulos et al. | |
| 6,897,693 B2 | 5/2005 | Kim | |
| 6,917,229 B2 | 7/2005 | Cho | |
| 7,282,978 B2 * | 10/2007 | Lee | 327/175 |
| 7,602,876 B2 | 10/2009 | Harrison | |
| 7,863,957 B2 * | 1/2011 | Jang et al. | 327/175 |
| 2008/0191757 A1* | 8/2008 | Choi | 327/149 |
| 2008/0252350 A1* | 10/2008 | Shin et al. | 327/175 |
| 2009/0115475 A1* | 5/2009 | Oh | 327/158 |

FOREIGN PATENT DOCUMENTS

JP 2009-089311 4/2009
KR 1020050006885 A 8/2011

\* cited by examiner

*Primary Examiner* — Hai L Nguyen
(74) *Attorney, Agent, or Firm* — William Park & Associates Ltd.

(57) ABSTRACT

A clock signal duty correction circuit includes: a first transition timing control unit configured to generate a first control signal for controlling a rising timing of a duty correction clock signal by using a clock signal; a second transition timing control unit configured to generate a second control signal for varying a falling timing of the duty correction clock signal by using the clock signal according to a code signal; and a differential buffer unit configured to generate the duty correction clock signal, whose rising time or falling time is adjusted, in response to the first control signal and the second control signal.

11 Claims, 2 Drawing Sheets

CLOCK SIGNAL DUTY CORRECTION CIRCUIT

CROSS-REFERENCES TO RELATED APPLICATION

The present application claims priority under 35 U.S.C. §119(a) to Korean application number 10-2010-0040549, filed on Apr. 30, 2010, in the Korean Intellectual Property Office, which is incorporated herein by reference in its entirety as set forth in full.

BACKGROUND

1. Technical Field

The present invention relates generally to a correction circuit, and more particularly to a clock signal duty correction circuit.

2. Related Art

A conventional clock signal duty correction circuit has employed a method of correcting a duty rate (hereinafter, referred to as a duty) of a clock signal by adjusting a slew rate of rising and falling edges of the clock signal and a method of correcting a duty of a clock signal by varying a delay time using a delay line.

However, the method of adjusting the slew rate incurs a problem that limits a bandwidth of a clock signal and causes jitters.

Furthermore, a method using the delay line increases a circuit area and a transfer delay time due to the delay line, thus increasing a duty correction time.

SUMMARY

A clock signal duty correction circuit capable of reducing a circuit area and a duty correction time is described herein.

In an embodiment of the present invention, a clock signal duty correction circuit includes: a first transition timing control unit configured to generate a first control signal for controlling a rising timing of a duty correction clock signal by using a clock signal; a second transition timing control unit configured to generate a second control signal for varying a falling timing of the duty correction clock signal by using the clock signal according to a code signal; and a differential buffer unit configured to generate the duty correction clock signal, whose rising time or falling time is adjusted, in response to the first control signal and the second control signal.

In another embodiment of the present invention, a clock signal duty correction circuit includes: a first delay unit configured to delay a clock signal by a first delay time and generate a first delay clock signal; a second delay unit configured to delay the clock signal by a second delay time and generate a second delay clock signal; a phase mixer unit configured to mix the clock signal and the second delay clock signal according to a weight adjusted in response to a control code, and generate a third delay clock signal; a differential buffer unit configured to generate a duty correction clock signal in response to the first delay clock signal and the third delay clock signal; and a control code generation unit configured to detect a duty of the clock signal by using the duty correction clock signal, and generate the control code corresponding to the detected duty of the clock signal.

BRIEF DESCRIPTION OF THE DRAWINGS

Features, aspects, and embodiments are described in conjunction with the attached drawings, in which.

DETAILED DESCRIPTION

Hereinafter, a clock signal duty correction circuit according to the present invention will be described below with reference to the accompanying drawings through exemplary embodiments.

Figure 1:
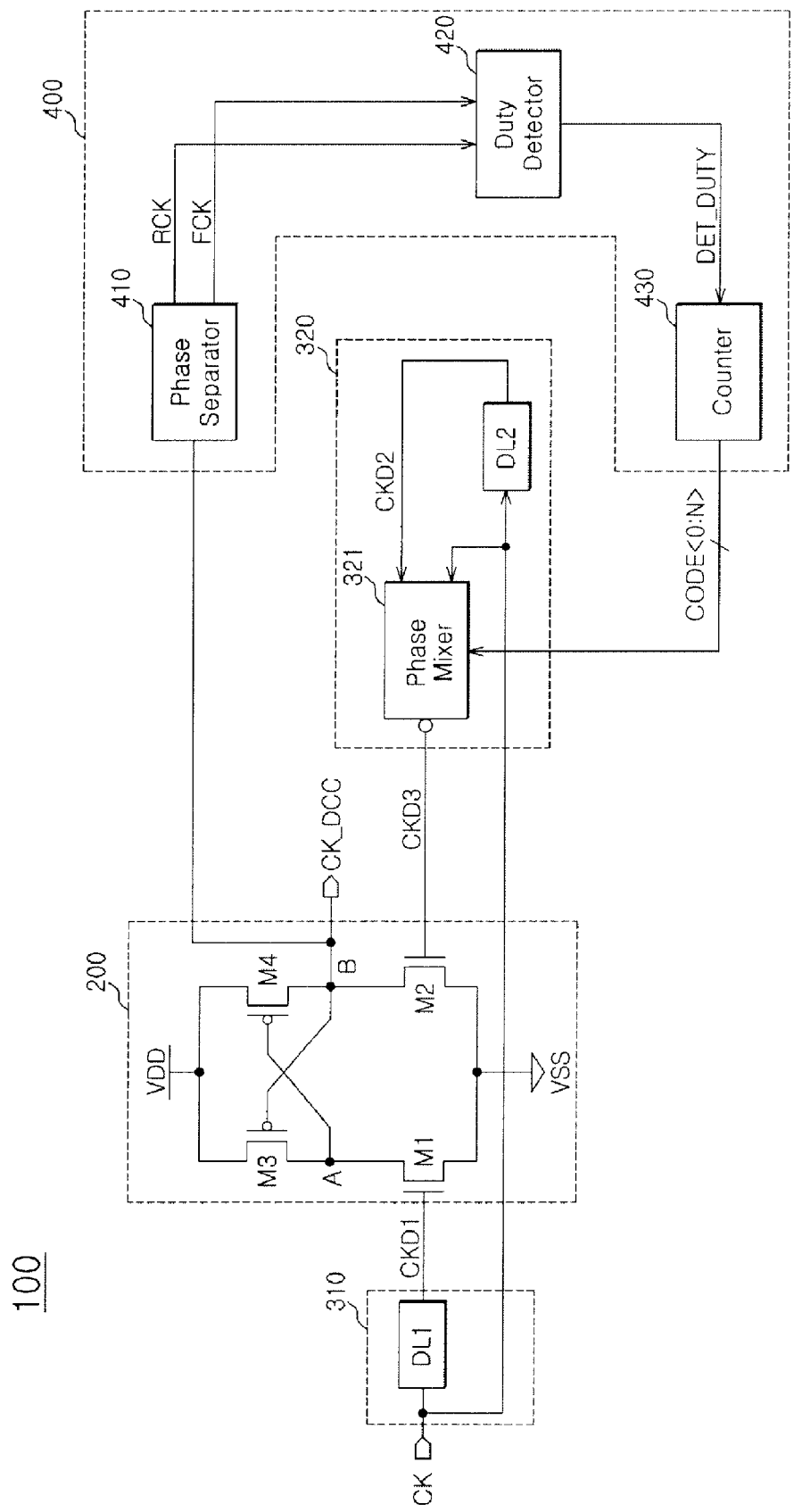
FIG. 1 is a block diagram of a clock signal duty correction circuit according to an embodiment of the present invention.

As illustrated in FIG. 1, a clock signal duty correction circuit 100 according to an embodiment of the present invention includes a first transition timing control unit 310, a second transition timing control unit 320, a differential buffer unit 200, and a control code generation unit 400.

The first transition timing control unit 310 is configured to generate a first control signal, which is a first delay clock signal CKD1, by using a clock signal CK for controling the rising timing of a duty correction clock signal CK_DCC.

The first transition timing control unit 310 includes a first delay unit DL1.

The first delay unit DL1 is configured to delay the clock signal CK by a first delay time and generate the first delay clock signal CKD1.

The second transition timing control unit 320 is configured to generate a second control signal for varying the falling timing of the duty correction clock signal CK_DCC by using the clock signal CK according to a code signal, which is made of control codes CODE<0:N>, received from the control code generation unit 400.

The second transition timing control unit 320 includes a second delay unit DL2 and a phase mixer 321.

The second delay unit DL2 is configured to delay the clock signal CK by a second delay time and generate a second delay clock signal CKD2.

The second delay time may be an integer multiple of the first delay time, for example, two times the first delay time.

The phase mixer 321 is configured to mix the clock signal CK and the second delay clock signal CKD2 in proportion to a predetermined weight value in response to the control codes CODE<0:N> and generate a second control signal, which is a third delay clock signal CKD3, by inverting the phase of the mixed signal.

For example, upon an initial operation, the phase mixer 321 may be configured to mix the clock signal CK and the second delay clock signal CKD2 at a weight of 1:1 according to the control codes CODE<0:N> outputted from a counter 430.

The differential buffer unit 200 is configured to generate the duty correction clock signal CK_DCC in response to the first delay clock signal CKD1 and the third delay clock signal CKD3.

The differential buffer unit 200 includes first through fourth transistors M1, M2, M3, M4.

As to the first transistor M1, the source is connected to a ground terminal, the drain is connected to a first node A, and the gate is connected to the 1st transition timing unit to receive the first delay clock signal CKD1. The first transistor M1 pulls down the first node A in response to the first delay clock signal CKD1.

As to the second transistor M2, the source is connected to the ground terminal, the drain is connected to a second node B, and the gate is connected to the second transition timing control unit 320 to receive the third delay clock signal CKD3.

The second transistor M2 pulls down the second node B in response to the third delay clock signal CKD3.

As to the third transistor M3, the source is connected to a power supply voltage terminal, the drain is connected to the first node A, and the gate is connected to the second node B.

As to the fourth transistor M4, the source is connected to the power supply voltage terminal, the drain to which the second node B is coupled, and a gate to which the first node A is coupled.

The control code generation unit 400 is configured to detect a duty of the clock signal CK by using the duty correction clock signal CK_DCC and generate the control codes CODE<0:N> corresponding to the detected duty of the clock signal CK.

The control code generation unit 400 includes a phase separator 410, a duty detector 420, and a counter 430.

The phase separator 410 is configured to separate a phase of the duty correction clock signal CK_DCC and generate a first phase clock signal RCK and a second phase clock signal FCK.

The first phase clock signal RCK and the second phase clock signal FCK have opposite phases to each other, and the first phase clock signal RCK has the same phase as that of the duty correction clock signal CK_DCC.

The duty detector 420 is configured to detect a duty of the duty correction clock signal CK_DCC by using the first phase clock signal RCK and the second phase clock signal FCK and generate a duty detection signal DET_DUTY.

The duty detector 420 is configured to output the duty detection signal DET_DUTY at a high level when the high level duration of the first phase clock signal RCK is longer than the low level duration of the first phase clock signal RCK.

The counter 430 is configured to vary, that is, increase or decrease, the control codes CODE<0:N> in response to the duty detection signal DET_DUTY.

For example, the counter 430 may be configured to increase the code values of the control codes CODE<0:N> when the duty detection signal DET_DUTY is at a high level.

The increase of the code values of the control codes CODE<0:N>> when the duty detection signal DET_DUTY is at a high level is merely exemplary, and the increase or decrease of the code values may be changed depending on the circuit design of the counter 430 and the phase mixer 321.

The operation of the clock signal duty correction circuit 100 according to an embodiment of the present invention will be described below with reference to FIG. 2.

Figure 2:
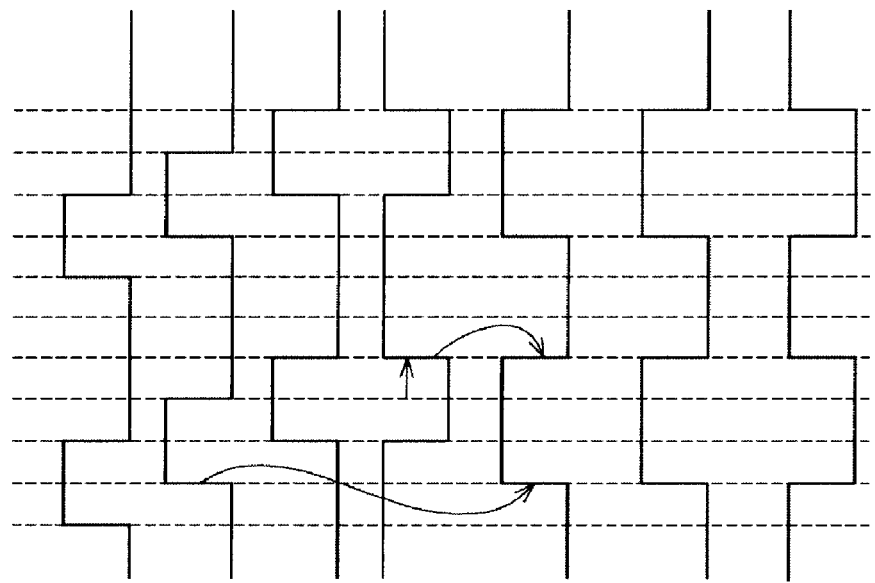
FIG. 2 is a timing diagram of the clock signal duty correction circuit according to an embodiment of the present invention.
Figure 2:
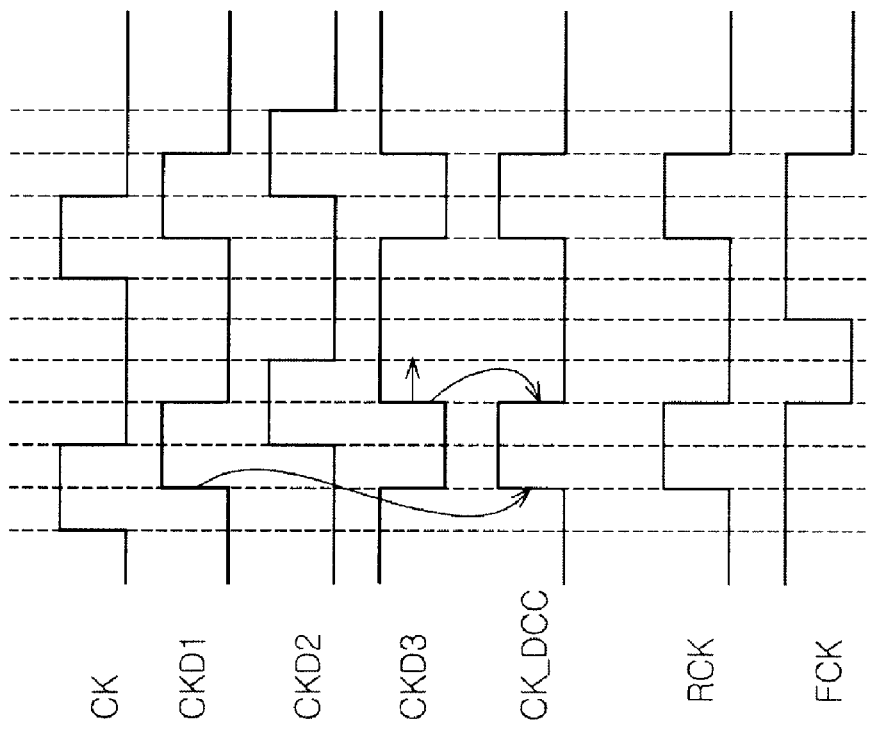

FIG. 2 is a timing diagram showing the output signals of the clock signal duty correction circuit 100 when the high level duration of the clock signal CK is shorter than the low level duration of the clock signal CK.

The clock signal CK passes through the first delay unit DL1 and is outputted as the first delay clock signal CKD1.

The first transistor M1 of the differential buffer unit 200 pulls down the first node A in response to the first delay clock signal CKD1.

As the first transistor M1 of the differential buffer unit 200 pulls down the first node A, the duty correction clock signal CK_DCC changes to a high level.

The phase mixer 321, upon an initial operation, mixes the clock signal CK and the second delay clock signal CKD2 at a weight of 1:1 according to the control codes CODE<0:N> outputted from the counter 430 and generates the third delay clock signal CKD3 by inverting the phase of the mixed signal.

As described above, the delay time of the first delay unit DL1 is the first delay time, and the delay time of the second delay unit DL2 is the second delay time. For example, the second delay time may be two times the first delay time as shown in FIG. 2.

Since the clock signal CK and the second delay clock signal CKD2 are mixed at a weight of 1:1, the third delay clock signal CKD3 has the delay time corresponding to the middle of the clock signal CK and the second delay clock signal CKD2.

That is, the third delay clock signal CKD3 is delayed by the first delay time with respect to the clock signal CK and has a phase opposite to that of the clock signal CK.

Therefore, the first delay clock signal CKD1 and the third delay clock signal CKD3 have the substantially identical delay time.

This is done for operating the clock signal duty correction circuit 100 on a basis that the high level duration of the clock signal CK is substantially identical to the low level duration of the clock signal CK upon the initial operation.

Therefore, the duty correction clock signal CK_DCC outputted from the differential buffer unit 200 upon the initial operation has a duty substantially identical to that of the clock signal CK.

However, as assumed above, the high level duration of the clock signal CK is shorter than the low level duration of the clock signal CK.

Thus, the high level duration of the first phase clock signal RCK outputted from the phase separator 140 is also shorter than the low level duration of the first phase clock signal RCK.

Meanwhile, since the second phase clock signal FCK has a phase opposite to that of the first phase clock signal RCK, the low level duration is shorter than the high level duration.

The duty detector 420 periodically performs the duty detection and generates the duty detection signal DET_DUTY in each detection period.

Since the high level duration of the first phase clock signal RCK is shorter than the low level duration of the first phase clock signal RCK, the duty detector 420 outputs the duty detection signal DET_DUTY at a low level.

The counter 430 decreases the code values of the control codes CODE<0:N> in response to the duty detection signal DET_DUTY of a low level.

The phase mixer 321 increases the weight of the second delay clock signal CKD2 with respect to the clock signal CK according to the control codes CODE<0:N> having the code values decreased as compared to the early stage, and mixes the second delay clock signal CKD2 and the clock signal CK.

Therefore, the third delay clock signal CKD3 has a delay value increased more than before.

Due to the third delay clock signal CKD3, the second transistor M2 of the differential buffer unit 200 is turned on at a later time than before, and pulls down the node B.

As the second transistor M2 is turned on and pulls down the second node B, the duty correction clock signal CK_DCC changes to a low level at a later time than before.

Since the duty correction clock signal CK_DCC changes to a low level at a later time than before, the high level duration of the duty correction clock signal CK_DCC increases.

In a case where the duty detection signal DET_DUTY of a high level is repetitively outputted or the duty detection signal DET_DUTY of a low level is repetitively outputted, this would mean that the duty correction is not completed.

Meanwhile, in a case where the duty detection signal DET_DUTY is alternately outputted at a high level and a low level, this would mean that the high level duration of the duty correction clock signal CK_DCC becomes substantially identical to the low level duration of the duty correction clock signal CK_DCC.

Therefore, when the duty detection signal DET_DUTY is alternately outputted at a high level and a low level, it is determined that the high level duration of the duty correction clock signal CK_DCC becomes substantially identical to the low level duration of the duty correction clock signal CK_DCC, and the clock signal duty correction is completed.

According to the embodiments of the present invention, the jitters are prevented from being generated from which to achieve the high-speed operation without limiting the bandwidth of the clock signal by correcting the duty by controlling the falling timing of the clock signal.

While certain embodiments have been described above, it will be understood to those skilled in the art that the embodiments described are by way of example only. Accordingly, the clock signal duty correction circuit described herein should not be limited based on the described embodiments. Rather, the clock signal duty correction circuit described herein should only be limited in light of the claims that follow when taken in conjunction with the above description and accompanying drawings.

What is claimed is:

1. A clock signal duty correction circuit comprising:
   a first transition timing control unit configured to generate a first control signal for controlling a rising timing of a duty correction clock signal by using a clock signal;
   a second transition timing control unit configured to generate a second control signal for varying a falling timing of the duty correction clock signal by using the clock signal according to a code signal;
   a differential buffer unit configured to generate the duty correction clock signal, capable of adjusting rising time or falling time, in response to the first control signal and the second control signal, and
   a control code generation unit configured to detect a duty of the clock signal by using the duty correction clock signal and generate the code signal corresponding to the detected duty of the clock signal,
   wherein the control code generation unit comprises:
   a phase separator configured to separate a phase of the duty correction clock signal and generate a first phase clock signal and a second phase clock signal;
   a duty detector configured to generate a duty detection signal by using the first phase clock signal and the second phase clock signal; and
   a counter configured to vary the code signal in response to the duty detection signal.

2. The clock signal duty correction circuit according to claim 1, wherein the first transition timing control unit comprises a delay unit configured to delay the clock signal by a first delay time and generate the first control signal.

3. The clock signal duty correction circuit according to claim 2, wherein the second transition timing control unit comprises:
   a delay unit configured to delay the clock signal by a second delay time and generate a delay signal; and
   a phase mixer configured to mix the clock signal and the delay signal according to a weight adjusted in response to the code signal, and generate the second control signal by inverting a phase of the mixed signal.

4. The clock signal duty correction circuit according to claim 3, wherein the second delay time is an integer multiple of the first delay time.

5. The clock signal duty correction circuit according to claim 3, wherein the phase mixer is configured to be applied same weight to the clock signal and the delay signal as initial values.

6. A clock signal duty correction circuit comprising:
   a first delay unit configured to delay a clock signal by a first delay time and generate a first delay clock signal;
   a second delay unit configured to delay the clock signal by a second delay time and generate a second delay clock signal;
   a phase mixer unit configured to mix the clock signal and the second delay clock signal according to a weight adjusted in response to a control code and generate a third delay clock signal;
   a differential buffer unit configured to generate a duty correction clock signal in response to the first delay clock signal and the third delay clock signal; and
   a control code generation unit configured to detect a duty of the clock signal by using the duty correction clock signal, and generate the control code corresponding to the detected duty of the clock signal.

7. The clock signal duty correction circuit according to claim 6, wherein the second delay time is an integer multiple of the first delay time.

8. The clock signal duty correction circuit according to claim 6, wherein the phase mixer unit is configured to be applied same weight to the clock signal and the second delay clock signal as initial values.

9. The clock signal duty correction circuit according to claim 6, wherein the control code generation unit comprises:
   a phase separator configured to separate a phase of the duty correction clock signal and generate a first phase clock signal and a second phase clock signal;
   a duty detector configured to generate a duty detection signal by using the first phase clock signal and the second phase clock signal; and
   a counter configured to vary the control code in response to the duty detection signal.

10. The clock signal duty correction circuit according to claim 9, wherein a phase of the first phase clock signal is opposite to a phase of the second phase clock signal.

11. The clock signal duty correction circuit according to claim 6, wherein the differential buffer unit comprises:
    a first transistor configured to control a rising timing of the duty correction clock signal in response to the first delay clock signal; and
    a second transistor configured to control a falling timing of the duty correction clock signal in response to the third delay clock signal.

* * * * *